(12) United States Patent
Liang et al.

(10) Patent No.: US 9,559,277 B2
(45) Date of Patent: Jan. 31, 2017

(54) LIGHT EMITTING DIODE MODULE STRUCTURE AND MANUFACTURING METHOD THEREOF

(71) Applicant: WISETOP TECHNOLOGY CO., LTD., Hsinchu, TN (US)

(72) Inventors: Wei-Chen Liang, Hsinchu County (TW); Pin Chang, Hsinchu (TW)

(73) Assignee: WISETOP TECHNOLOGY CO., LTD., Hsinchu (TW)

( * ) Notice: Subject to any disclaimer, the term of this patent is extended or adjusted under 35 U.S.C. 154(b) by 0 days.

(21) Appl. No.: 14/658,712

(22) Filed: Mar. 16, 2015

(65) Prior Publication Data
US 2016/0118560 A1    Apr. 28, 2016

(30) Foreign Application Priority Data
Oct. 27, 2014  (TW) .............................. 103137030 A

(51) Int. Cl.
  *H01L 33/00*  (2010.01)
  *H01L 33/62*  (2010.01)
  *H01L 33/38*  (2010.01)
  *H01L 33/40*  (2010.01)

(52) U.S. Cl.
  CPC ............ *H01L 33/62* (2013.01); *H01L 33/382* (2013.01); *H01L 33/405* (2013.01)

(58) Field of Classification Search
  USPC ......... 257/81, 82, 91, 98, 99, 100, 116, 117, 257/432–437, 749, E33.056–E33.059, 257/E25.032, 40, E33.001–E33.077, 257/E33.054, E25.026; 438/25–28
  See application file for complete search history.

(56) References Cited

U.S. PATENT DOCUMENTS

| 2009/0003400 A1* | 1/2009 | Nagahama | H01L 33/483 372/50.23 |
| 2013/0127332 A1* | 5/2013 | Chen | C09K 11/025 313/503 |
| 2013/0277696 A1* | 10/2013 | Matsui | H01L 33/382 257/96 |

* cited by examiner

*Primary Examiner* — Tram H Nguyen
(74) *Attorney, Agent, or Firm* — Muncy, Geissler, Olds & Lowe, P.C.

(57) ABSTRACT

A light emitting diode module structural and a manufacturing method thereof are disclosed. The manufacturing method includes the steps as follows. A base and a light emitting diode die are provided. The light emitting diode die may include a first semiconductor layer and a second semiconductor layer. The light emitting diode die is disposed on the base. A buffer layer is formed to cover the light emitting diode die. A first opening and a second opening are formed on the first semiconductor layer and the second semiconductor layer, respectively. The second opening exposes the second semiconductor layer by penetrating the first semiconductor layer. A conductive pattern layer is formed on the buffer layer, and is electrically connected with the first semiconductor layer and the second semiconductor layer via the first opening and the second opening, respectively.

18 Claims, 11 Drawing Sheets

LIGHT EMITTING DIODE MODULE STRUCTURE AND MANUFACTURING METHOD THEREOF

CROSS-REFERENCE TO RELATED APPLICATION

This application claims priority from Taiwan Patent Application No. 103137030, filed on Oct. 27, 2014, in the Taiwan Intellectual Property Office, the content of which are hereby incorporated by reference in their entirety for all purposes.

BACKGROUND OF THE INVENTION

1. Field of the Invention

This application relates to a light emitting diode die module structure and a manufacturing method thereof, and more particularly, to integration and a one-time completed structure of a light emitting diode die and a manufacturing method thereof.

2. Description of the Related Art

Regarding the conventional method of manufacturing the light emitting diode module, it is mainly to form the necessary circuit on a substrate firstly, and when contacts are reserved on the circuit and the light emitting diode die is attached to a predetermined position on the substrate. Afterwards, the contacts on the light emitting diode die and that on the circuit are connected by bond wires.

The structure of the aforementioned module may be able to accomplish objective of the modulation design, but the heat conductivity between the light emitting diode die and the substrate may become badly off as sapphire layer with a certain thickness which is disposed therebetween. Besides, the bond wire is of tiny thread diameter, resulting that the thermal energy generated in a light emitting state of the light emitting diode die may hence incapable of being dissipated via the bond wire. As a result, the component quality may be degraded easily as the duration under a long-term high temperature condition.

In addition, the light emitting diode die is formed by disposing electrodes thereon, and when manufacturing a light emitting diode module, it is firstly to form a buffer layer (or a protective layer) on the light emitting diode die and then form openings on the buffer layer corresponding to the electrodes for further wire bonding. The size of the electrode, however, is extremely tiny, and for the sake of promoting the percentage of alignment, the size of the corresponding opening on the buffer layer may be designed larger to ensure that the electrode can be exposed sufficiently. But the oversized opening may lead to a lower open rate of the light emitting diode module, as well as to cause a requirement for higher alignment precision between the opening and the electrode.

SUMMARY OF THE INVENTION

In view of the preceding technical problems, objective of the present invention is to provide a light emitting diode die module structure which may include a base, at least one light emitting diode die, a buffer layer and a conductive pattern layer. The substrate may have an upper surface. The at least one light emitting diode die may be disposed on the upper surface of the substrate, and may include a first semiconductor layer and a second semiconductor layer. The buffer layer may cover the at least one light emitting diode die and may have a first opening and a second opening on the first semiconductor layer and the second semiconductor layer of the at least one light emitting diode die respectively, and the second opening may expose the second semiconductor layer by penetrating the first semiconductor. The conductive pattern layer may be formed on the buffer layer, and the conductive pattern layer may be electrically connected with the first semiconductor layer and the second semiconductor layer of the at least one light emitting diode die via the first opening and the second opening, respectively.

Preferably, the at least one light emitting diode die may exclude electrodes, and the conductive pattern layer may directly contact the first and the second semiconductor layers.

Preferably, an upper surface of the buffer layer may further include a reflective layer or a protective layer.

Preferably, the structure of the present invention may further include a fluorescent layer, and the fluorescent layer may be disposed between the upper surface of the base and the at least one light emitting diode die.

Preferably, the buffer layer may include a dam-shaped structure and a filling block adjacent to the at least one light emitting diode die, the at least one light emitting diode die may be disposed in the dam-shaped structure, the filling block may cover the at least one light emitting diode die, and the first opening and the second opening may be formed on the filling block.

Preferably, the filling block may include at least one fluorescent agent disposed therein.

Preferably, the base may be a light-transmittable base and the light-transmittable base may be made of one of a glass, a polycarbonate, an acrylic and a combination thereof.

Preferably, the buffer layer may include at least one fluorescent agent.

Preferably, the structure of the present invention may further include a dome structure, and the dome structure may be disposed between the buffer layer and the at least one light emitting diode die, and an upper surface of the dome structure may be disposed with a reflective layer.

Preferably, the structure of the present invention may further include two module contacts, and the two module contacts may be disposed on the upper surface or a lower base of the substrate, the conductive pattern layer, or a side face of the module, selectively, and the two module contacts may be electrically connected with the conductive pattern layer.

According to the preceding purpose, the present invention is further to provide a method of manufacturing a light emitting module which may include the following steps. A base and at least one light emitting diode die may be provided, and the at least one light emitting diode die may include a first semiconductor layer and a second semiconductor layer. The at least one light emitting diode die may be disposed on the base. A buffer layer may be formed to cover the at least one light emitting diode die. A first opening and a second opening may be formed respectively on the first semiconductor layer and the second semiconductor layer of the at least one light emitting diode die, and the second opening may expose the second semiconductor layer by penetrating the first semiconductor layer. An insulating layer may be disposed at side wall of the second opening, a conductive pattern layer may be formed on the buffer layer, and the conductive patter layer may be electrically connected with the first semiconductor layer and the second semiconductor layer of the at least one light emitting diode die respectively via the first opening and the second opening respectively.

Preferably, the buffer layer may be made of a manner of coating, screen printing, stamping, transfer printing, spray coating, spin coating, injection molding, injection, or a combination thereof.

Preferably, the method of the present invention may further include a step of forming a reflective layer or a protective layer on an upper surface of the buffer layer.

Preferably, before the at least one light emitting diode die is disposed on the base, the method of the present invention may further include a step of forming a fluorescent layer on the base and disposing the at least one light emitting diode die on the fluorescent layer.

Preferably, before the at least one light emitting diode die is disposed on the base, the method of the present invention may further include steps of forming a dam-shaped structure on the base, disposing the at least one light emitting diode die in the dam-shaped structure, and disposing a filler between the at least one light emitting diode die and the dyke-shaped structure to cover the at least one light emitting diode die. The dam-shaped structure and the filler may form the buffer layer.

Preferably, the buffer layer may include at least one fluorescent agent.

Preferably, the substrate may be a light-transmittable base and the light-transmittable base may be made of one of a glass, a polycarbonate, an acrylic and a combination thereof.

Preferably, the buffer layer may include at least one fluorescent agent.

Preferably, before the buffer layer is formed, the method of the present invention may further include steps of forming a dome structure on a top of the at least one light emitting diode die, and disposing a reflective layer on an upper surface of the dome structure.

Preferably, the method of the present invention may further include a step of forming two module contacts on an upper surface or a lower surface of the base, the conductive pattern layer, or a side face of the module and the two module contacts may be electrically connected with the conductive pattern layer.

BRIEF DESCRIPTION OF THE DRAWINGS

Hereinafter, embodiments of the present invention will be described in detail with reference to the accompanying drawings so that those skilled in the art to which the present invention pertains can realize the present invention, wherein.

DETAILED DESCRIPTION OF THE PREFERRED EMBODIMENTS

As used herein, the term "and/or" includes any and all combinations of one or more of the associated listed items. Expressions such as "at least one of," when preceding a list of elements, modify the entire list of elements and do not modify the individual elements of the list.

It shall be understood that when one element such as a layer, a thin film, a region or a plate is referred as "on" the other elements, it is meant that an intermediate element may exit on the other elements directly or therebetween.

Figure 1:
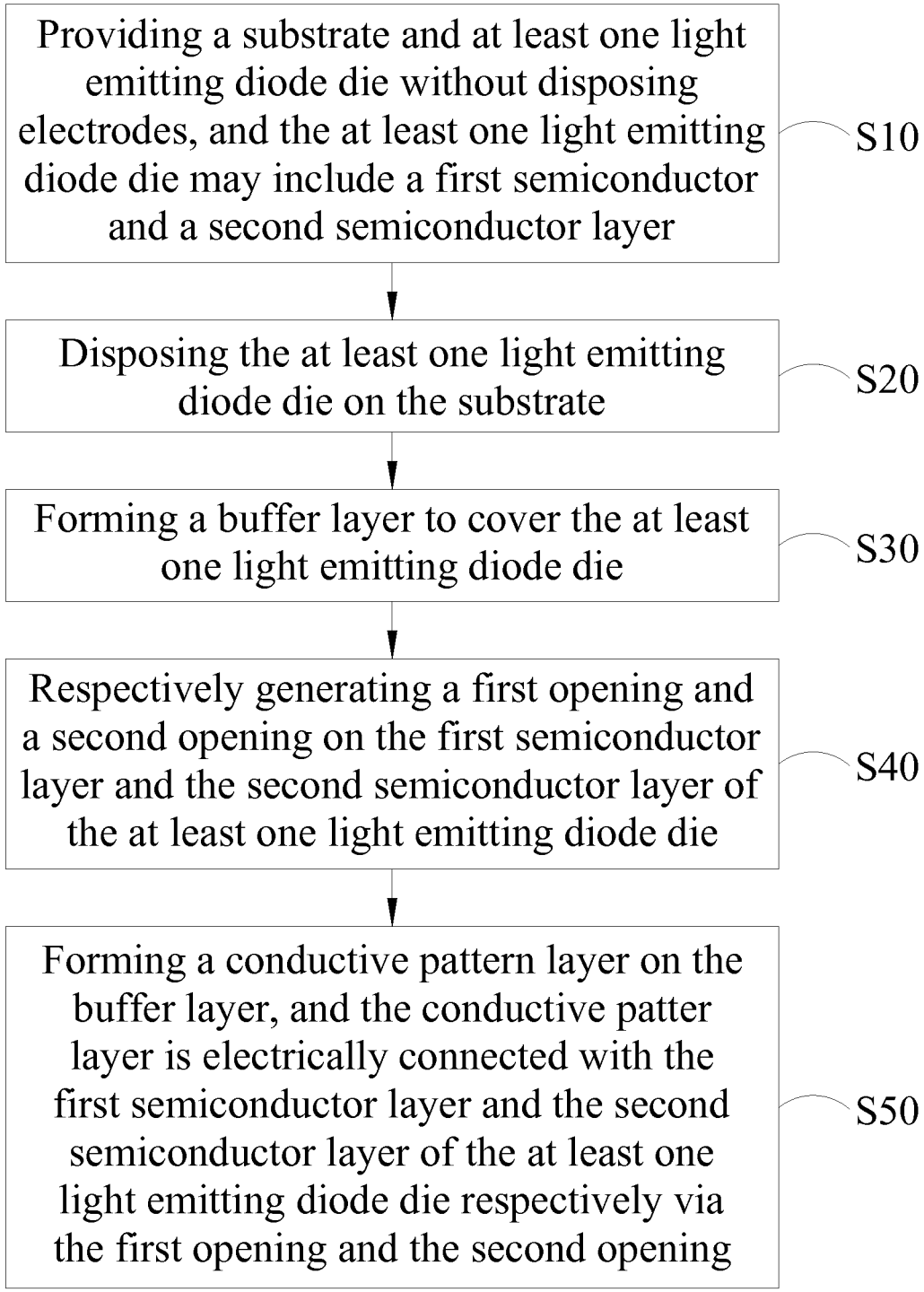
FIG. 1 is a flow chart of a manufacturing method of a light emitting diode module in accordance with the present invention.

Please refer to FIG. 1 and FIGS. 2A to 2D together. FIG. 1 is a flow chart of a manufacturing method of a light emitting diode module in accordance with the present invention, and FIGS. 2A to 2D are schematic diagrams for showing process of a manufacturing method of a light emitting diode module in accordance with the present invention. In the FIGS., a method of manufacturing a light emitting diode die which may include the following steps is described in sections below.

In step S10, a base 1 and a light emitting diode die 2 are provided, and the light emitting diode die 2 includes a first semiconductor layer 21, a second semiconductor layer 22 and a substrate 23. It is noteworthy that the light emitting diode die 2 mentioned here is a product cut from a light emitting diode wafer, and electrodes may be disposed thereon, or not. Consequently, the following steps will explain how the light emitting diode die 2 cut from a light emitting diode wafer is integrated and completed one off packaging, and to be electrically disposed on the base 1.

The first semiconductor layer 21 may be a p-type semiconductor layer, and the second semiconductor layer 22 may be an n-type semiconductor layer. The base 1 may be a light-transmittable substrate and the light-transmittable substrate may be made of one of a glass, a polycarbonate, an acrylic and a combination thereof.

Figure 2A:
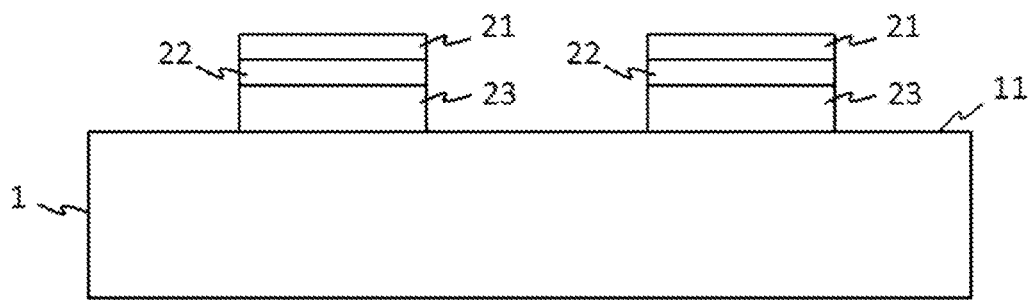
FIGS. 2A to 2D are schematic diagrams for showing process of a manufacturing method of a light emitting diode module in accordance with the present invention.
Figure 2B:
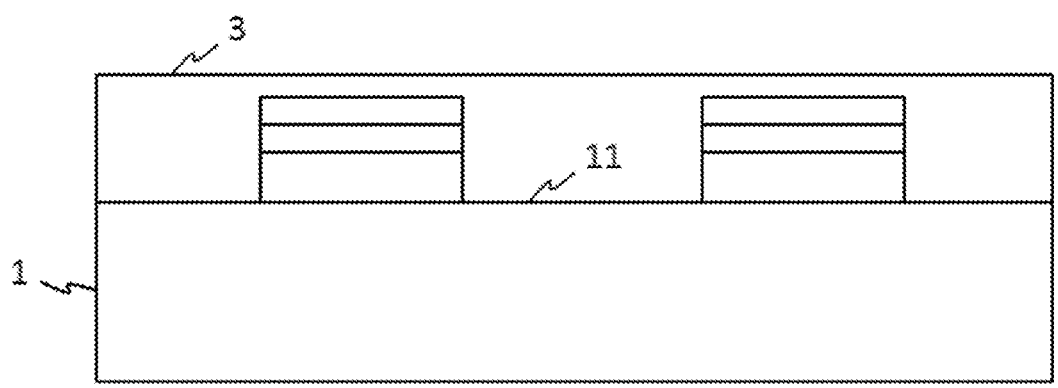
Figure 2C:
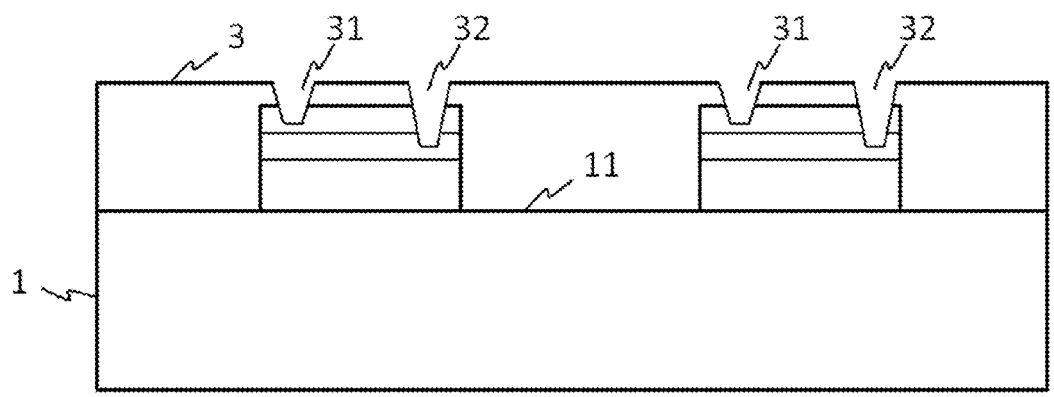

In step S20, the at least one light emitting diode die 2 is disposed on the base 1 as shown in FIG. 2A. It is noteworthy that disposal of a pair of the light emitting diode dies 2 on the base 1 as shown in FIG. 2A is taken as an example, and the present disclosure is not limited thereto.

In step S30, a buffer layer 3 is formed to cover the at least one light emitting diode die 2, and the buffer layer 3 may include at least one fluorescent agent based on practical needs. The buffer layer 3 may be made by a manner of coating, screen printing, stamping, transfer printing, spray coating, spin coating, injection molding, injection, or a combination thereof.

In step S40, a first opening 31 and a second opening 32 may be respectively formed on the first semiconductor layer 21 and the second semiconductor layer 22 of the at least one light emitting diode die 2. In practice, as the second opening 32 penetrates the first semiconductor layer 21, if leakage current is desired to avoid, it has to insulate side wall of the second opening 32 and as a result the conductive layer may be not lead to a short circuit between the first semiconductor layer 21 and the second semiconductor layer 22.

In step S50, a conductive pattern layer 4 is formed on the buffer layer 3, and the conductive pattern layer 4 may be electrically connected with the first semiconductor layer 21 and the second semiconductor layer 22 of the at least one light emitting diode die 2 respectively via the first opening 31 and the second opening 32. The first opening 31 and the second opening 32 are formed by one of laser drilling, dry etching, wet etching and a combination thereof when at least one part of the buffer layer 3 is formed.

It should be noted that the conductive pattern layer 4 is directly contacted the first semiconductor layer 21 and the second semiconductor layer 22. The so-called "directly contact" mentioned here is to indicate that the bond pad is not disposed on the light emitting diode die 2 originally and the conductive pattern layer 4 "forms the contact via with the semiconductor layer of the at least one light emitting diode die 2 directly". Besides, in the practical manufacturing process, a glue layer such as TiN, TaN, Al, Cr, Pt and Au and so on may be formed before the primary conductive metal layer is formed so as to increase the adhesion between the conductive pattern layer 4 and the first semiconductor layer 21 and the second semiconductor layer 22 that may be included in the definition of "directly contact".

Figure 3:
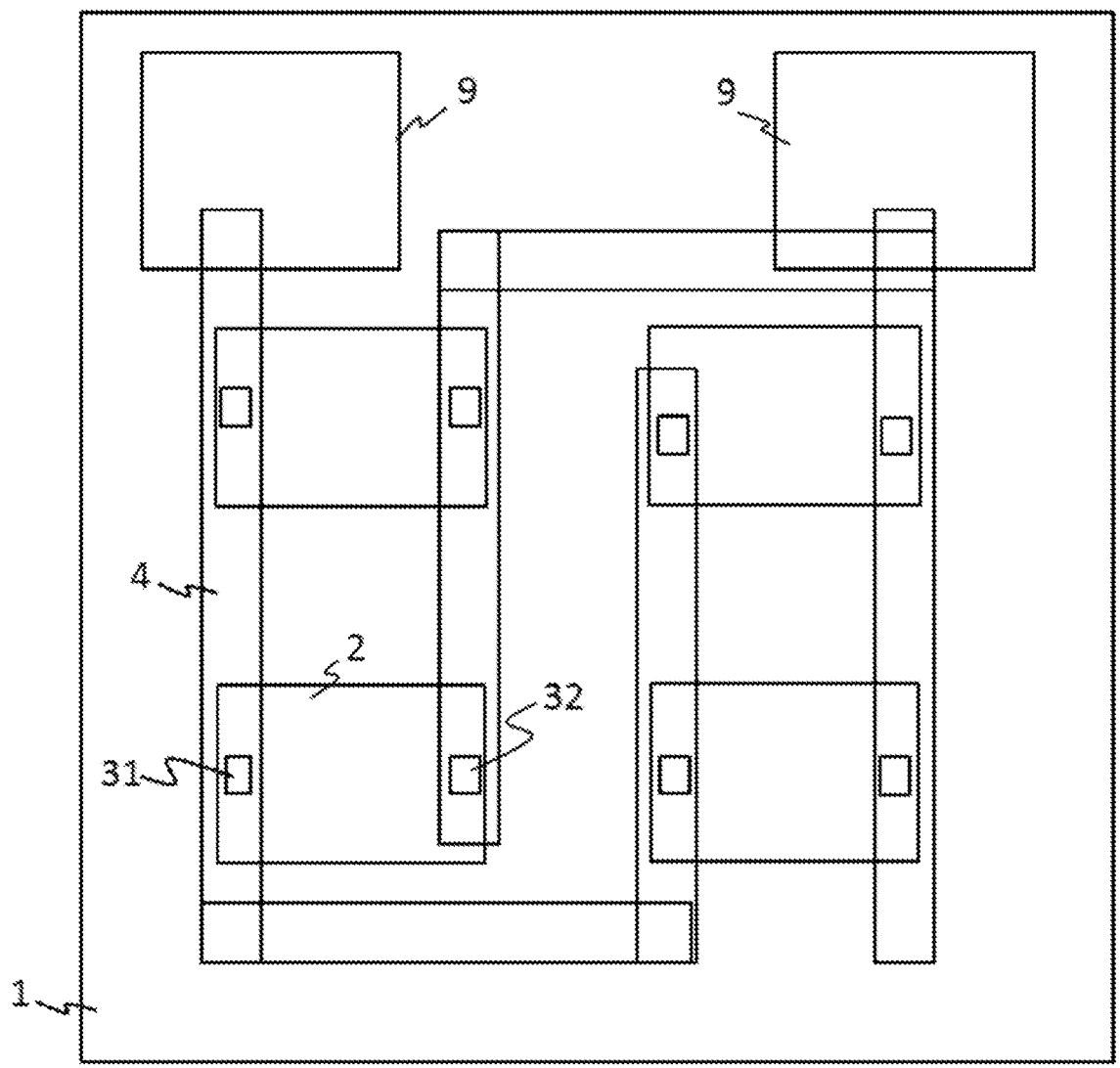
FIG. 3 is a top view of a light emitting diode module in accordance with the present invention.

When the steps S10 to S50 are completed, basic aspect of the light emitting diode die of the present invention is formed. Two module contacts 9 may be further formed on the upper surface 11 or a lower surface of the base 1, the conductive pattern layer 4, or a side face of the module according to the follow-up needs, and the two module contacts 9 may be electrically connected with conductive pattern layer as shown in FIG. 3. The two module contacts 9 may input/output a driving signal to drive the light emitting diode die 2 to emit light.

As the formation and package of the electrodes of a light emitting light diode module in accordance with the present invention are made in the same manufacturing process, size of the openings may be downsized as possible to promote the open rate of the light emitting diode module.

Figure 4:
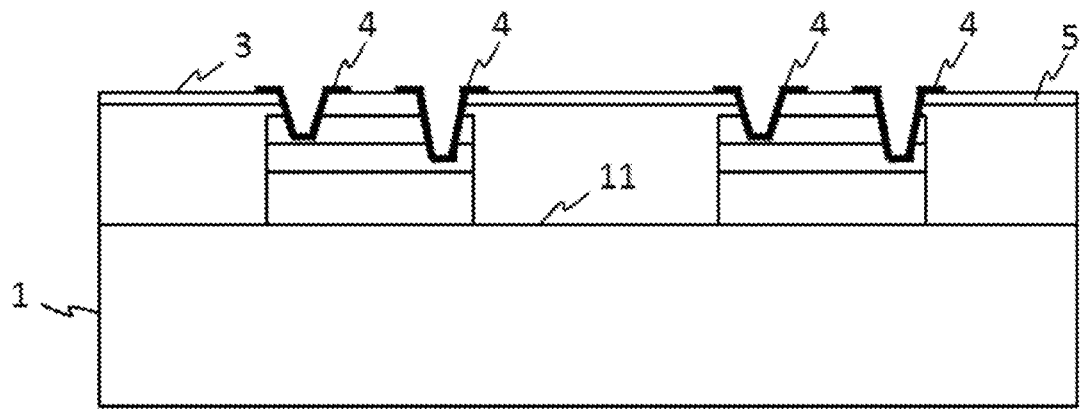
FIG. 4 is a schematic diagram of one embodiment of a light emitting diode module in accordance with the present invention.

Besides, as FIG. 4 shows that after step S30 and before step S40 is performed, a reflective layer 5 (or protective layer) may be formed on the upper surface 11 of the buffer layer 3.

Figure 5:
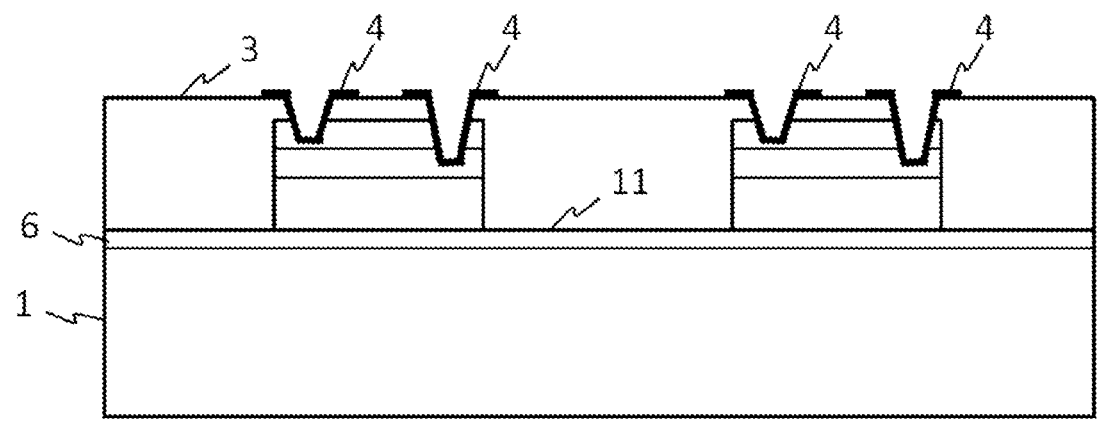
FIG. 5 is a schematic diagram of another embodiment of a light emitting diode module in accordance with the present invention.

Moreover, as FIG. 5 shows that after the step S10 and before the step S20 is performed, a fluorescent layer 6 may be formed on the upper surface 11 of the base 1, and the fluorescent layer 6 may be disposed between the base 1 and the light emitting diode die 2.

It should be noted that the light emitting diode die used in the present embodiment is preferably to use the light emitting diode die 2 without disposing electrodes, but is not limited thereto. The light emitting diode die 2 of the present invention can be provided with electrodes, and when the step S40 is performed, even though aligning the light emitting diode die 2 to the original electrode in the process of forming the opening is unnecessary, objective and advantage of the present invention can also be accomplished. That is, the primary technical feature in accordance with the present invention lies in the step concerning that the light emitting diode die 2 cut from a wafer is disposed on the substrate and then the second semiconductor layer 22 is exposed by penetrating the first semiconductor layer 21.

Figure 2D:
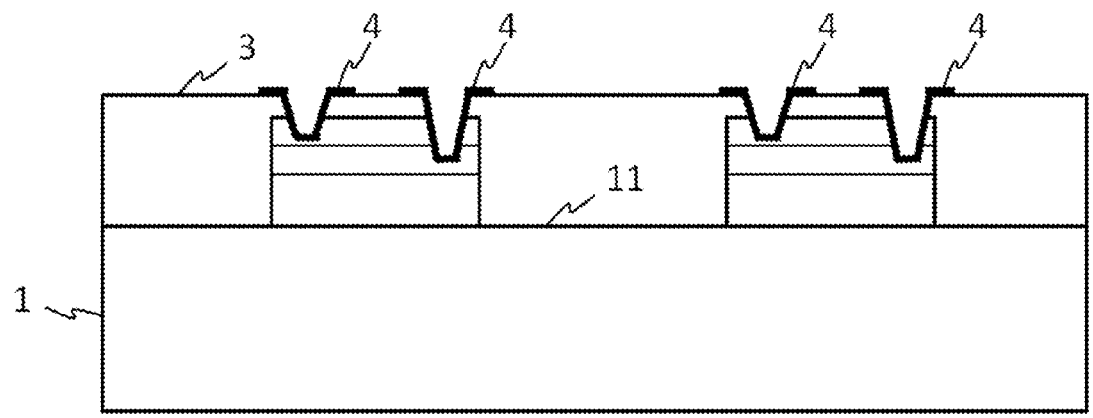

FIG. 2D shows the structure of the light emitting diode module in accordance with the present invention which includes the base 1, the at least one light diode die 2, the buffer layer 3 and the conductive pattern layer 4. The base 1 has the upper surface 11. The at least one light emitting diode die 2 is respectively disposed on the upper surface 11 of the base 1, and the at least one light emitting diode die 2 may include the first semiconductor layer 21 and the second semiconductor layer 22. The buffer layer 3 covers the at least one light emitting diode die 2 and have the first opening 31 and the second opening 32 on the first semiconductor layer 21 and the second semiconductor layer 22 of the at least one light emitting diode die 2 respectively, and the second opening 32 exposes the second semiconductor layer 22 by penetrating the first semiconductor 21. The conductive pattern layer 4 may be formed on the buffer layer 3, and the conductive pattern layer 4 is electrically connected with the first semiconductor layer 21 and the second semiconductor layer 22 of the at least one light emitting diode die 2 via the first opening 31 and the second opening 32, respectively. The details have been explained in the preceding contents, and the details are omitted.

Figure 6:
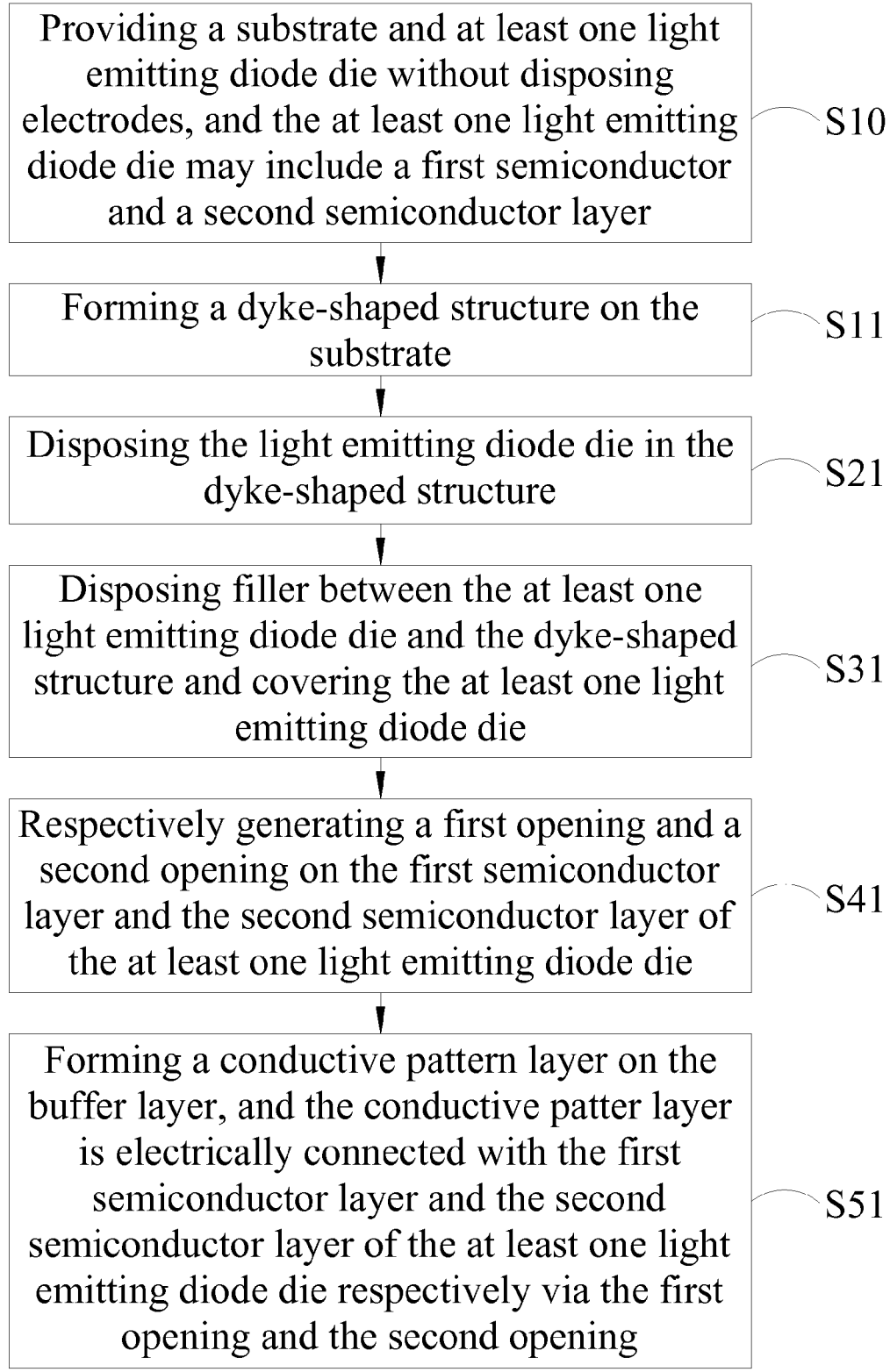
FIG. 6 is a flow chart of one embodiment of a manufacturing method of a light emitting diode module in accordance with the invention.

Please refer to FIG. 6 which is a flow chart of one embodiment of a method of manufacturing the light emitting diode module in accordance with the invention. In step S10, the base 1 and the electrode-free light emitting diode die 2 are provided. The light emitting diode die 2 may include the first semiconductor layer 21 and the second semiconductor layer 22 and the substrate 23.

Figure 7A:
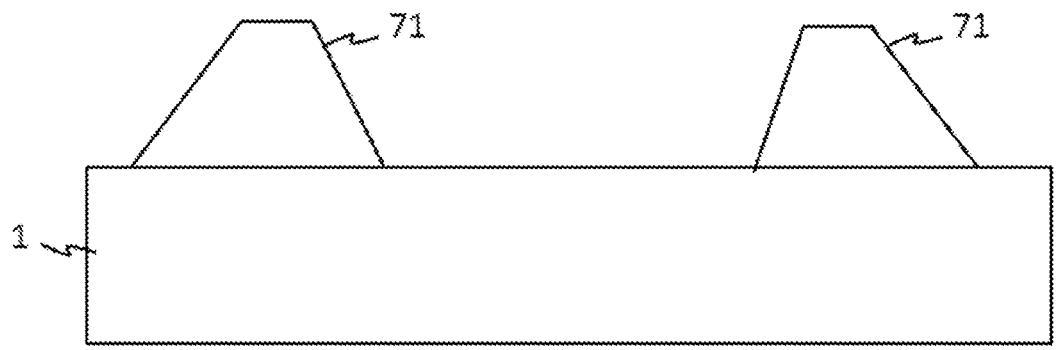
FIGS. 7A to 7E are schematic diagrams for showing process of a manufacturing method of a light emitting diode module in accordance with the present invention.
Figure 7B:
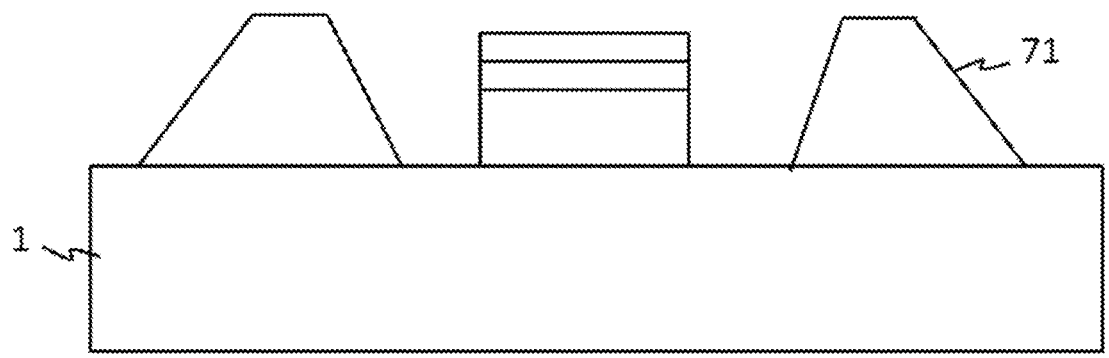
Figure 7C:
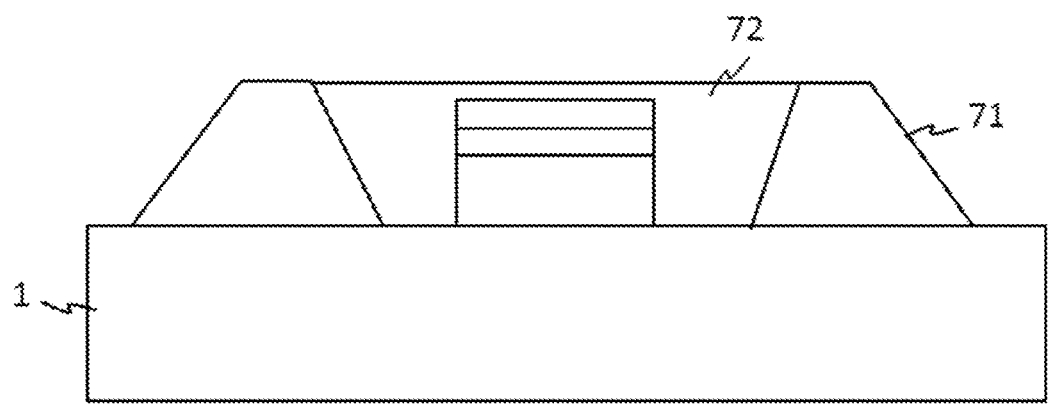
Figure 7D:
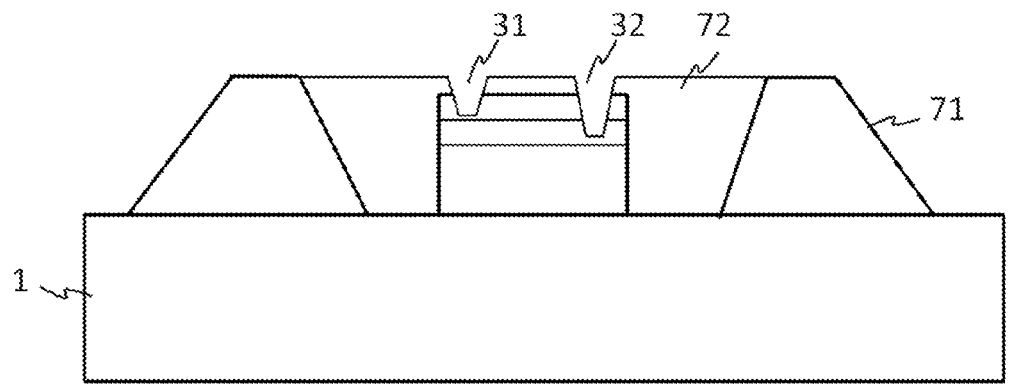
Figure 7E:
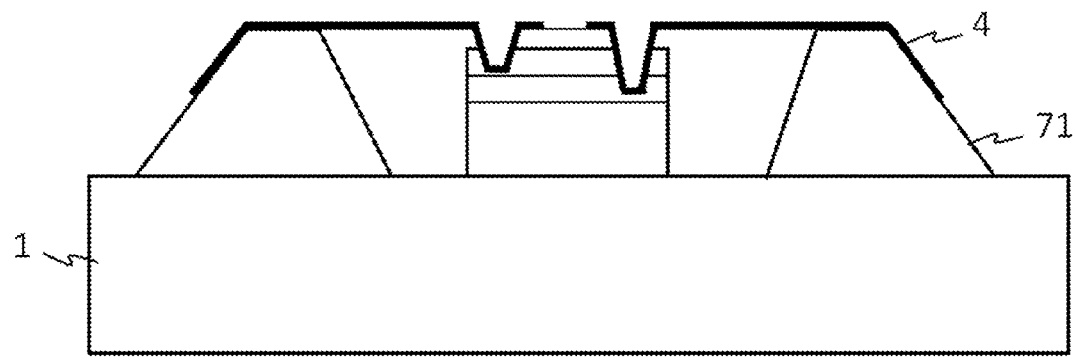

In step S11, a dam-shaped structure 71 may be formed on the base 1 as shown in FIG. 7A. In step S21, the light emitting diode die 2 is disposed in the dam-shaped structure 71 as shown in FIG. 7B. In step S31, the filler is disposed between the at least one light emitting diode die 2 and the dam-shaped structure 71 to cover the light emitting diode die 2 as shown in FIG. 7C. As a result, the buffer layer 3 may be formed between dam-shaped structure 71 and the filler.

Next, in step S41, the first opening 31 and the second opening 32 may be respectively formed on the first semiconductor layer 21 and the second semiconductor 22 of the at least one light emitting diode die 2. Besides, as mentioned above, the side wall of second opening 32 may be insulated, and unnecessary details are omitted herein.

In step S51, the conductive pattern layer 4 is formed on the buffer layer 3, and the conductive pattern layer 4 may be electrically connected with the first semiconductor layer 21 and the second semiconductor 22 of the at least one light emitting diode die 2 via the first opening 31 and the second opening 32. The at least one fluorescent agent may be included in a filling block 72. In addition, as mentioned above, the conductive pattern layer 4 is directly contacted the first semiconductor layer 21 and the second semiconductor 22, and the definition of the so-called "directly contact" mentioned herein can be referred to above, and unnecessary details are hence no longer given herein.

Figure 8:
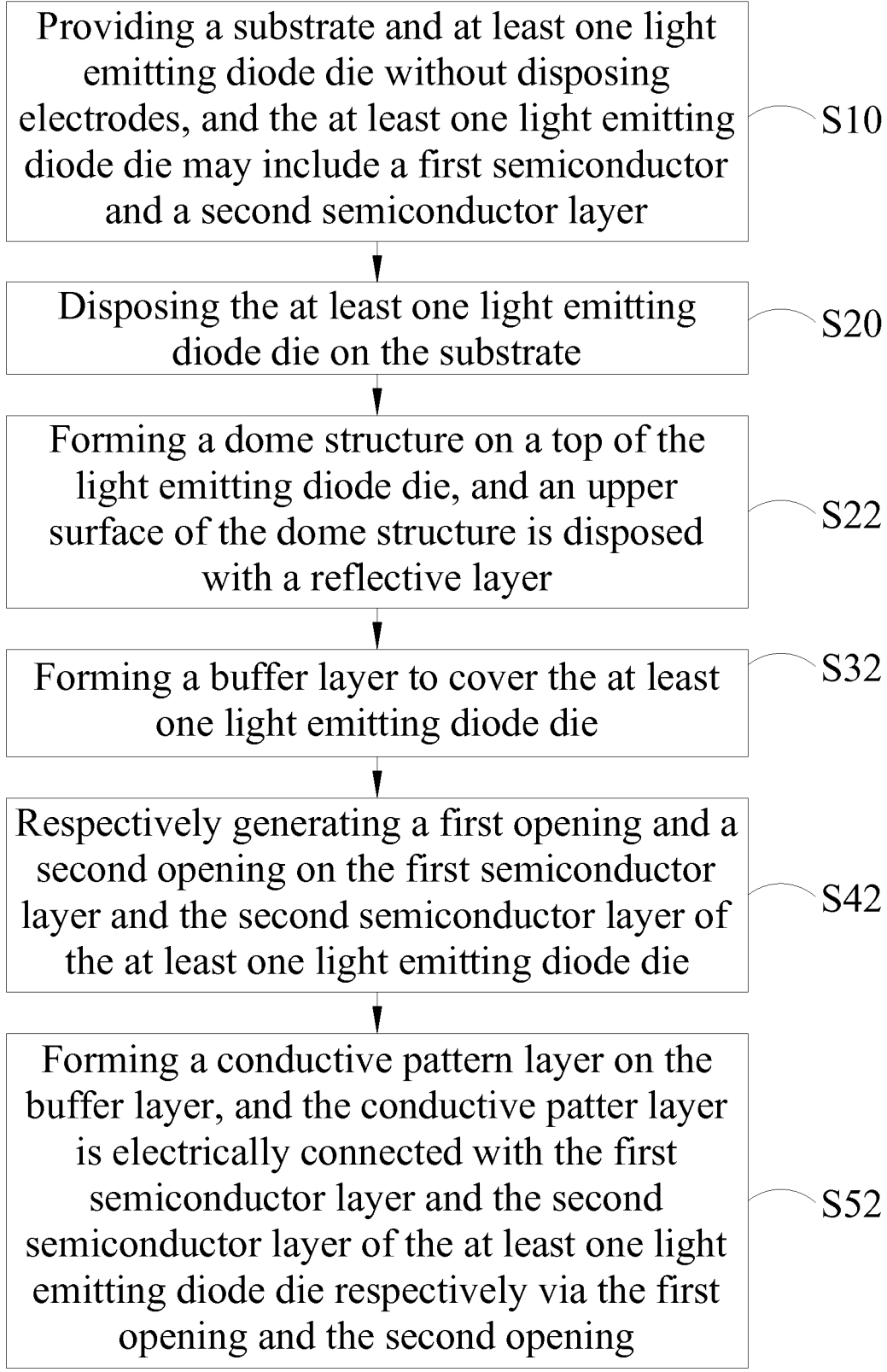
FIG. 8 is a flow chart of one embodiment of a manufacturing method of a light emitting diode module in accordance with the invention.
Figure 9A:
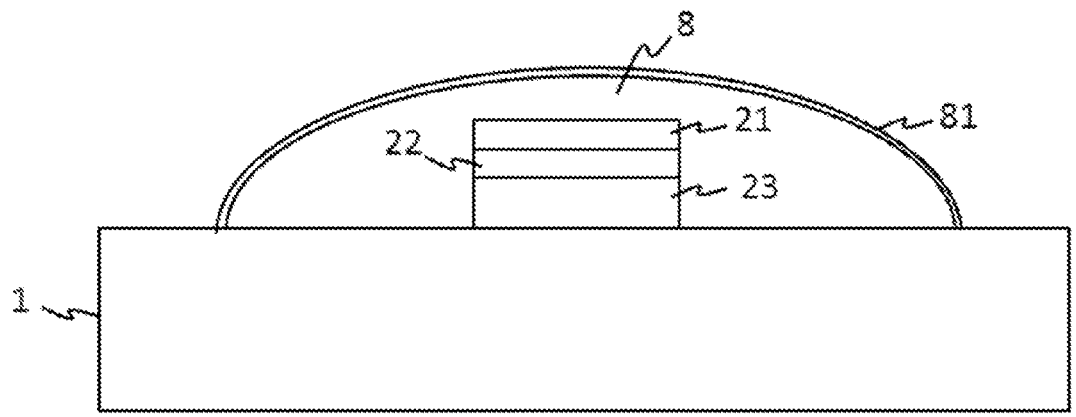
FIGS. 9A to 9C are schematic diagrams for showing process of a manufacturing method of a light emitting diode module in accordance with the invention.
Figure 9B:
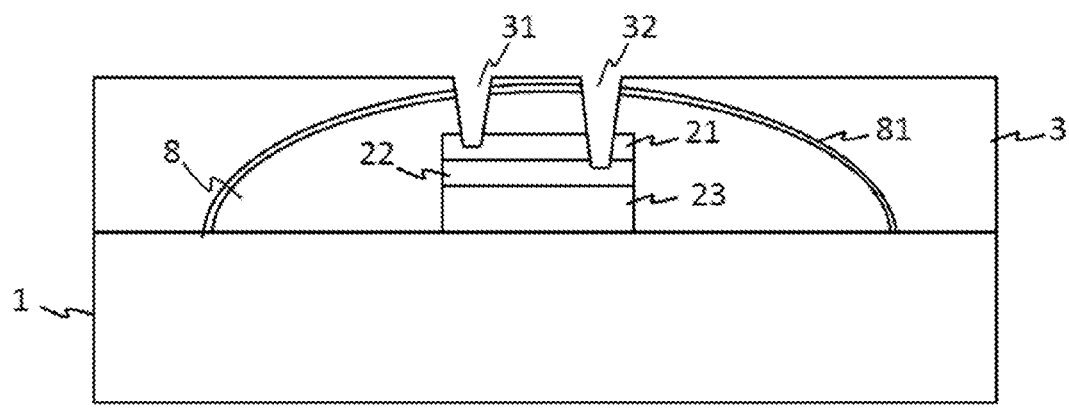
Figure 9C:
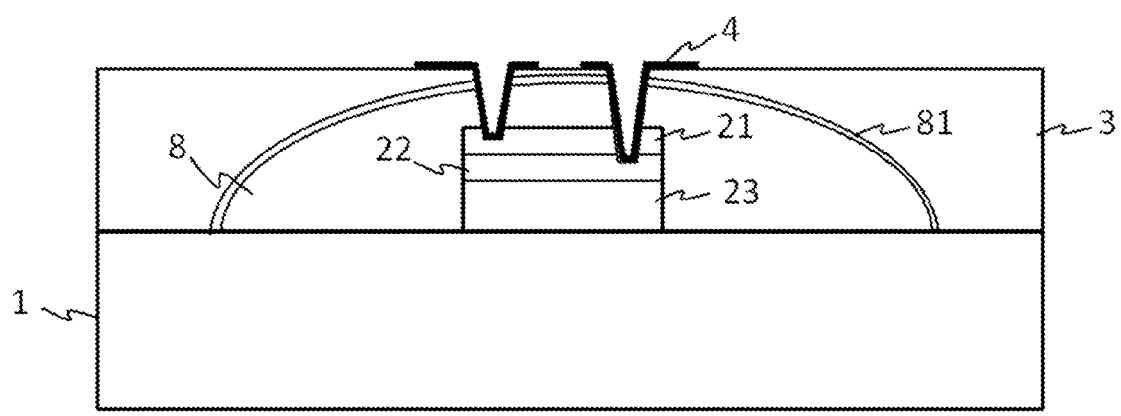

Please refer to FIG. 8 which is a flow chart of one embodiment of a manufacturing method of the light emitting diode module in accordance with the invention, and FIGS. 9A to 9C which are schematic diagrams for showing process of a manufacturing method of a light emitting diode module in accordance with the invention.

In step S10, the base 1 and the electrode-free light emitting diode die 2 are provided. The light emitting diode die 2 may include the first semiconductor layer 21 and the second semiconductor 22 and the substrate 23. In step S20, the light emitting diode die 2 may be disposed on the base 1 as shown in FIG. 2A. In step S22, a dome structure 8 may be formed on a top of the light emitting diode die 2, and a reflective layer 81 may be disposed on an upper surface of the dome structure 8.

In step S32, the buffer layer 3 is formed to cover the light emitting diode die 2. The buffer layer 3 may include at least one fluorescent agent according to the practical needs. The buffer layer 3 may be made by a manner of coating, screen printing, stamping, transfer printing, spray coating, spin coating, injection molding, injection, or a combination thereof.

In step S42, the first opening 31 and the second opening 32 may be respectively formed on the first semiconductor layer 21 and the second semiconductor layer 22 of the at least one light emitting diode die 2. Besides, as mentioned above, the side wall of the second opening 32 may be insulated, and unnecessary details are omitted herein.

In step S52, the conductive pattern layer 4 may be formed on the buffer layer 3, and the conductive pattern layer 4 may be electrically connected with the first semiconductor layer 21 and the second semiconductor layer 22 of the at least one light emitting diode die 2 respectively via the first opening 31 and the second opening 32. Besides, as mentioned above, the conductive pattern layer 4 is directly contacted the first semiconductor 21 and the second semiconductor 22, and the definition of the so-called "directly contact" mentioned herein can be referred to above, and unnecessary details are omitted herein.

In addition, if it is necessary to test the light emitting diode die prior to the light emitting diode die being packaged, those light emitting diode dies without disposing with contact electrodes may use alternating current electric field to enable the light emitting diode dies inducing voltage to emit light. For example, (light transmissive and conductive) parallel plate electrodes can be used to cross through two semiconductor layers of the light emitting diode die and to apply voltage. As the light emitting diode is a type of diode and able to automatically rectify and charge on parasite capacitance, and thus, when voltage of the parasite capacitance is higher than the forward turn-on voltage, a current is formed and light emits. Afterwards, a photoelectric sensor may be used to detect light-emitting condition of each light emitting diode die to determine good and bad of the light emitting diode die, and accordingly to sort it out to decide the follow-up process.

It should be noted that the embodiment of the aforementioned light emitting diode module structure and method of manufacturing the same is explained by using a light emitting diode die without disposing electrodes, but the present disclosure is not limited thereto. The difference between the present invention and the conventional technique depends on that the first semiconductor layer is penetrated to form the opening (by means of etching method or other means) when a light emitting diode die used in the present invention is disposed on the base, which is what the conventional technique lacks for. The advantage the technical feature brings has been mentioned above, and unnecessary details are omitted herein. As a result, when it comes to the other applications, even a light emitting diode die has been disposed with electrodes or other metal layer, penetrating (by means of etching method or other means) a first semiconductor layer when the light emitting diode die is disposed on a substrate to form opening still belongs to scope of the present invention.

While the means of specific embodiments in present invention has been described by reference drawings, numerous modifications and variations could be made thereto by those skilled in the art without departing from the scope and spirit of the invention set forth in the claims. The modifications and variations should in a range limited by the specification of the present invention.

What is claimed is:

1. A light emitting diode module structure, comprising:
a base having an upper surface;
at least one light emitting diode die, disposed on the upper surface of the base, and comprising a first semiconductor layer and a second semiconductor layer;
a buffer layer covering the at least one light emitting diode die and having a first opening and a second opening on the first semiconductor layer and the second semiconductor layer of the at least one light emitting diode die respectively, and the second opening penetrating the first semiconductor layer; and
a conductive pattern layer formed on the buffer layer, and the conductive pattern layer electrically connected with the first semiconductor layer and the second semiconductor layer of the at least one light emitting diode die respectively via the first opening and the second opening; wherein the at least one light emitting diode die excludes electrodes, and the conductive pattern layer is electrically connected with the first semiconductor layer and the second semiconductor layer.

2. The light emitting diode module structure of claim 1, wherein the first opening and the second opening are formed by one of laser drilling, dry etching, wet etching and a combination thereof when at least one part of the buffer layer is formed.

3. The light emitting diode module structure of claim 1, wherein an upper surface of the buffer layer further comprises a reflective layer or a protective layer.

4. The light emitting diode module structure of claim 1, further comprising a fluorescent layer, and the fluorescent layer disposed between the upper surface of the base and the at least one light emitting diode die.

5. The light emitting diode module structure of claim 1, wherein the buffer layer comprises a dam-shaped structure and a filling block adjacent to the at least one light emitting diode die, the at least one light emitting diode die is disposed in the dam-shaped structure, the filling block covers the at least one light emitting diode die, and the first opening and the second opening are disposed on the filling block.

6. The light emitting diode module structure of claim 5, wherein the filling block comprises at least one fluorescent agent disposed therein.

7. The light emitting diode module structure of claim 1, wherein the base is a light-transmittable base and the light-transmittable base is made of one of a glass, a polycarbonate, an acrylic and a combination thereof.

8. The light emitting diode module structure of claim 1, further comprising a dome structure, and the dome structure disposed between the buffer layer and the at least one light emitting diode die, and an upper surface of the dome structure disposed with a reflective layer.

9. The light emitting diode module structure of claim 1, further comprising two module contacts, and the two module contacts disposed on the upper surface or a lower surface of the base, the conductive pattern layer, or a side face of the module, selectively, and the two module contacts electrically connected with the conductive pattern layer.

10. A method of manufacturing a light emitting module, comprising:
providing a base and at least one light emitting diode die, the at least one light emitting diode die comprising a first semiconductor layer and a second semiconductor layer;
disposing the at least one light emitting diode die on the base;

forming a buffer layer to cover the at least one light emitting diode die;

respectively forming a first opening and a second opening on the first semiconductor layer and the second semiconductor layer of the at least one light emitting diode die, wherein the first semiconductor layer is exposed by the first opening, and the second semiconductor layer is exposed by the second opening which penetrates the first semiconductor layer;

disposing an insulating layer at a side wall of the second opening, and forming a conductive pattern layer on the buffer layer, and electrically connecting the conductive patter layer with the first semiconductor layer and the second semiconductor layer of the at least one light emitting diode die respectively via the first opening and the second opening.

11. The method of claim 10, wherein the buffer layer is made of a manner of coating, screen printing, stamping, transfer printing, spray coating, spin coating, injection molding, injection, or a combination thereof.

12. The method of claim 10, further comprising: forming a reflective layer or a protective layer on an upper surface of the buffer layer.

13. The method of claim 10, further comprising: forming a fluorescent layer and disposing the at least one light emitting diode die on the fluorescent layer before the at least one light emitting diode die is disposed on the base.

14. The method of claim 10, before the at least one light emitting diode die is disposed on the base, the manufacturing method further comprising:

forming a dam-shaped structure on the base;

disposing the at least one light emitting diode die in the dam-shaped structure, and disposing a filler between the at least one light emitting diode die and the dam-shaped structure and covering the at least one light emitting diode die;

wherein the dam-shaped structure and the filler form the buffer layer.

15. The method of claim 10, wherein the base is a light-transmittable base made of one of a glass, a polycarbonate, an acrylic and a combination thereof.

16. The method of claim 10, wherein the buffer layer comprises at least one fluorescent agent.

17. The method of claim 10, before the buffer layer is formed, the method further comprising:

forming a dome structure on a top of the at least one light emitting diode die, and disposing a reflective layer on an upper surface of the dome structure.

18. The method of claim 10, further comprising: forming two module contacts on an upper surface or a lower surface of the base, the conductive pattern layer, or a side face of the module, and the two module contacts electrically connected with the conductive pattern layer.

* * * * *